United States Patent
Boselli et al.

(10) Patent No.: US 7,196,887 B2
(45) Date of Patent: Mar. 27, 2007

(54) PMOS ELECTROSTATIC DISCHARGE (ESD) PROTECTION DEVICE

(75) Inventors: Gianluca Boselli, Richardson, TX (US); Vijay Kumar Reddy, Plano, TX (US); Ekanayake Ajith Amerasekera, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 460 days.

(21) Appl. No.: 10/446,369

(22) Filed: May 28, 2003

(65) Prior Publication Data
US 2004/0240128 A1 Dec. 2, 2004

(51) Int. Cl.
H02H 9/00 (2006.01)
(52) U.S. Cl. ........................................ 361/56
(58) Field of Classification Search .............. 361/56; 257/355, 354
See application file for complete search history.

(56) References Cited

U.S. PATENT DOCUMENTS

| | | | |
|---|---|---|---|
| 5,714,783 A | 2/1998 | Duvvury | |
| 5,850,095 A | 12/1998 | Chen et al. | |
| 5,940,258 A | 8/1999 | Duvvury | |
| 5,962,898 A | 10/1999 | Duvvury | |
| 5,982,217 A | 11/1999 | Chen et al. | |
| 6,018,549 A * | 1/2000 | Reay et al. | 375/257 |
| 6,064,556 A * | 5/2000 | Ravanelli | 361/111 |
| 6,072,219 A * | 6/2000 | Ker et al. | 257/355 |
| 6,097,064 A * | 8/2000 | Saitoh et al. | 257/345 |
| 6,137,144 A | 10/2000 | Tsao et al. | |
| 6,143,595 A | 11/2000 | Hsu | |
| 6,147,538 A | 11/2000 | Andresen et al. | |
| 6,249,413 B1 | 6/2001 | Duvvury | |
| 6,304,127 B1 | 10/2001 | Lin | |
| 6,373,104 B1 | 4/2002 | Smith | |
| 6,465,768 B1 * | 10/2002 | Ker et al. | 250/214.1 |
| 6,566,715 B1 * | 5/2003 | Ker et al. | 257/355 |
| RE38,222 E * | 8/2003 | Wu | 257/356 |
| 6,724,592 B1 * | 4/2004 | Tong et al. | 361/56 |
| 6,912,109 B1 * | 6/2005 | Ker et al. | 361/56 |
| 6,958,896 B2 * | 10/2005 | Lin et al. | 361/56 |
| 2003/0048588 A1 | 3/2003 | Duvvury et al. | |

OTHER PUBLICATIONS

Y. Blecher and R. Fried "Zener substrate triggering for CMOS ESD protection devices." Electronics Letters Oct. 24, 1996 vol. 32 No. 22.*

"Non-uniform Bipolar conduction in Single Finger NMOS Transistors and Implications for Deep Submicron ESD Design", IRPS—International Reliability Physics Symposium Proceedings for the Year 2000, Kwang-Hoon Oh, Charvaka Duvvury, Craig Salling, Kaustav Banerjee and Robert W. Dutton, Published in 2000. 9 pgs.

"Process-related Effects on ESD Performance in Deep Submicron Technologies", Ajith Amerasekera and Vikas Gupta, Published date not available, 10 pgs.

(Continued)

Primary Examiner—Stephen W. Jackson
Assistant Examiner—Boris Benenson
(74) Attorney, Agent, or Firm—Rose Alyssa Keagy; W. James Brady; Frederick J. Telecky. Jr.

(57) ABSTRACT

A PMOS ESD protection device is disclosed in which gate and substrate coupling techniques are implemented to afford protection during positive ESD events. A snapback leg in curves capable of being produced in accordance with one or more aspects of the present invention is removed, and a trigger voltage at which the device turns on is thereby reduced so as to be less than a second voltage corresponding to a second breakdown region.

11 Claims, 5 Drawing Sheets

OTHER PUBLICATIONS

"Development of Substrate-Pumped nMOS Protection for a 0.13um Technology", Craig Salling, Jerry Hu, Jeff Wu, Charvaka Duvvury, Roger Cline and Rith Pok, Published date not available, 13 pgs.

"ESD-related Process Effects in Mixed-voltage Sub-0.5um Technologies", Vikas Gupta, Ajith Amerasekera, Sridhar Ramaswamy and Alwin Tsao, Published date not available, 9 pgs.

"Substrate Triggering and Salicide Effects on ESD Performance and Protection Circuit Design in Deep Submicron CMOS Processes", IEEE Electron Device Meeting Technical Digest, Ajith Amerasekera, Charvaka Duvvury, Vijay Reddy and Mark Rodder, 1995, pp. 547-550.

"A Novel NMOS Transistor for High Performance ESD Protection Devices in 0.18 um CMOS Technology Utilizing Salicide Process", EOS/ESD Symposium 00, Chang-Su Kim, Hong-Bae Park, Young-Gwan Kim, Dae-Gwan, Kang, Myoung-Goo Lee, Si-Woo Lee, Chan-Hee Jeon, Han-Gu Kim, Young-Jae Yoo and Han-Sub Yoon, pp. 407-412.

* cited by examiner

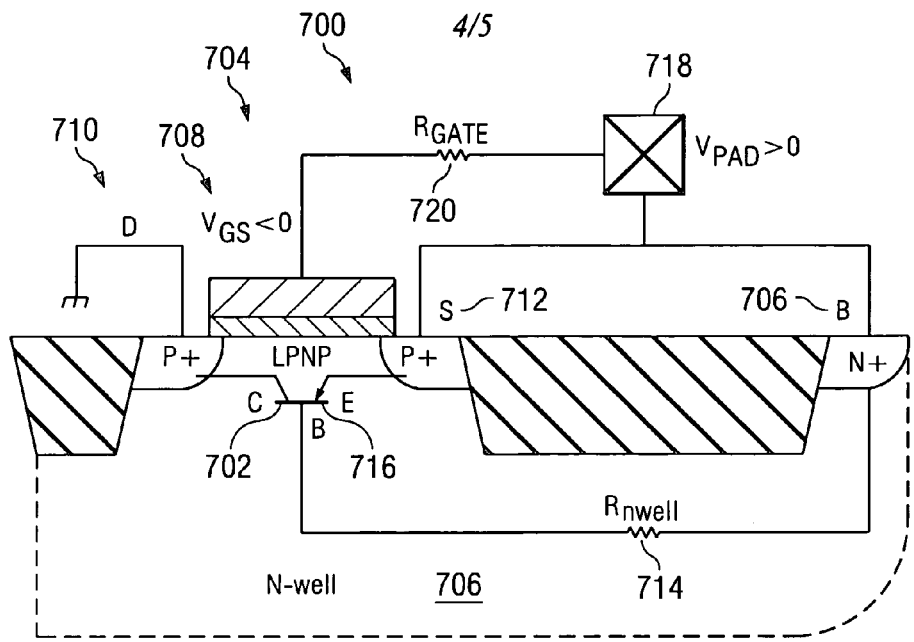
FIG. 7
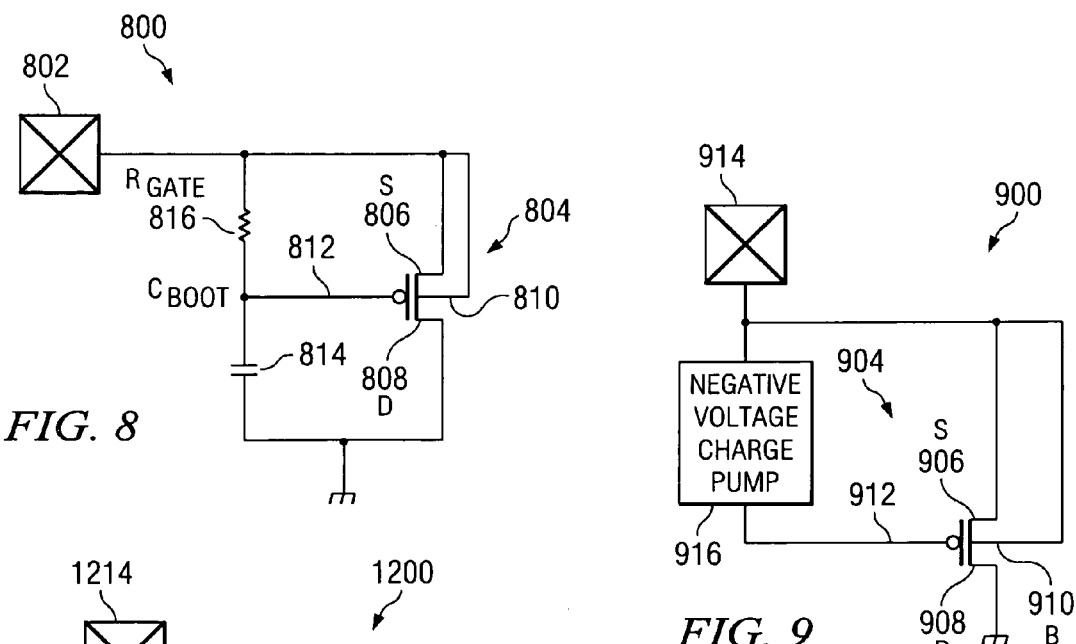
FIG. 8
FIG. 9
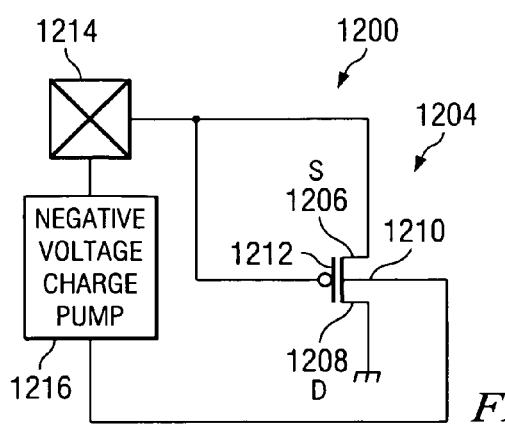
FIG. 12

PMOS ELECTROSTATIC DISCHARGE (ESD) PROTECTION DEVICE

FIELD OF INVENTION

The present invention relates generally to the art of semiconductor devices, and more particularly to PMOS based electrostatic discharge (ESD) protection devices.

BACKGROUND OF THE INVENTION

Electrostatic discharge (ESD) is a continuing problem in the design, manufacture and utilization of semiconductor devices. Integrated circuits (ICs) can be damaged by ESD events stemming from a variety of sources, in which large currents flow through the device in an uncontrolled fashion. In one such ESD event, a packaged IC acquires a charge when it is held by a human whose body is electrostatically charged. An ESD event occurs when the IC is inserted into a socket, and one or more of the pins of the IC package touch the grounded contacts of the socket. This type of event is known as a human body model (HBM) ESD stress. For example, a charge of about 0.6 μC can be induced on a body capacitance of 150 pF, leading to electrostatic potentials of 4 kV or greater. HBM ESD events can result in a discharge for about 100 nS with peak currents of several amperes to the IC. Another source of ESD is from metallic objects, known as the machine model (MM) ESD source, which is characterized by a greater capacitance and lower internal resistance than the HBM ESD source. The MM ESD model can result in ESD transients with significantly higher rise times than the HBM ESD source. A third ESD model is the charged device model (CDM), which involves situations where an IC becomes charged and discharges to ground. In this model, the ESD discharge current flows in the opposite direction in the IC than that of the HBM ESD source and the MM ESD source. CDM pulses also typically have very fast rise times compared to the HBM ESD source.

ESD events typically involve discharge of current between one or more pins or pads exposed to the outside of an integrated circuit chip. Such ESD current flows from the pad to ground through vulnerable circuitry in the IC, which may not be designed to carry such currents. Many ESD protection techniques have been thusfar employed to reduce or mitigate the adverse effects of ESD events in integrated circuit devices. Many conventional ESD protection schemes for ICs employ peripheral dedicated circuits to carry the ESD currents from the pin or pad of the device to ground by providing a low impedance path thereto. In this way, the ESD currents flow through the protection circuitry, rather than through the more susceptible circuits in the chip.

Such protection circuitry is typically connected to I/O and other pins or pads on the IC, wherein the pads further provide the normal circuit connections for which the IC was designed. Some ESD protection circuits carry ESD currents directly to ground, and others provide the ESD current to the supply rail of the IC for subsequent routing to ground. Rail-based clamping devices can be employed to provide a bypass path from the IC pad to the supply rail (e.g., VDD) of the device. Thereafter, circuitry associated with powering the chip is used to provide such ESD currents to the ground. Local clamps are more common, wherein the ESD currents are provided directly to ground from the pad or pin associated with the ESD event. Individual local clamps are typically provided at each pin on an IC, with the exception of the ground pin or pins.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates to electrostatic discharge (ESD) protection circuitry, and more particularly to PMOS based ESD protection devices capable of affording protection during positive ESD events. Gate and substrate coupling techniques are implemented in PMOS ESD protection devices to afford protection during positive ESD events. A snapback leg in curves capable of being produced in accordance with one or more aspects of the present invention is removed or substantially reduced, and a trigger voltage at which the device turns on is thereby reduced so as to be less than a second voltage corresponding to a second breakdown region.

According to one or more aspects of the present invention, an ESD protection circuit, for providing ESD protection to a pad includes a PMOS transistor having a source region, a drain region, a gate, and a bulk region, wherein the source region is coupled to the pad. The circuit also includes a coupling circuit coupled to the PMOS transistor, and operable to generate either a negative gate to source voltage or a negative bulk region voltage for the PMOS transistor during a positive electrostatic discharge event, thereby achieving a negative gate coupling or a negative substrate coupling for the PMOS transistor during the positive electrostatic discharge event.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 7 illustrates a cross sectional schematic view of at least a portion of a wafer whereon a gate coupling arrangement is disposed in accordance with one or more aspects of the present invention.

FIG. 8 is a schematic illustration of a circuit arrangement suitable to effect gate coupling in implementing a PMOS ESD protection device in accordance with one or more aspects of the present invention.

FIG. 9 is a schematic illustration of another circuit arrangement suitable to effect gate coupling in implementing a PMOS ESD protection device in accordance with one or more aspects of the present invention.

FIG. 12 is a schematic illustration of a circuit arrangement suitable to effect substrate coupling in implementing a PMOS ESD protection device in accordance with one or more aspects of the present invention.

DETAILED DESCRIPTION OF THE INVENTION

Figure 1:
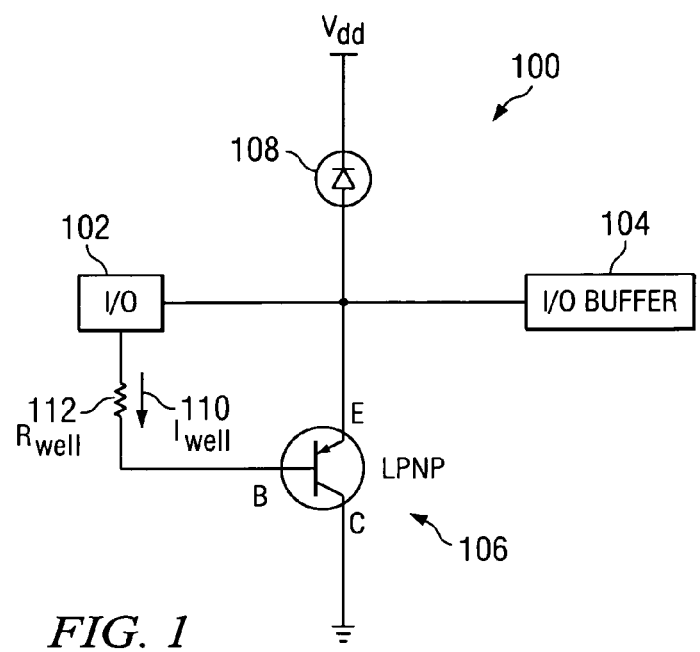
FIG. 1 is a schematic diagram illustrating a portion of an integrated circuit suitable for implementing one or more aspects of the PMOS ESD protection device of the present invention.

The present invention will now be described with reference to the attached drawings, wherein like reference numerals are used to refer to like elements throughout. The invention relates to ESD protection devices, such as PMOS devices having parasitic bipolar transistors (e.g., lateral PNPs, or LPNPs) associated therewith to facilitate a reduction in triggering voltages. Although examples of one or more applications of the present invention are hereinafter illustrated and described, it will be appreciated that other applications and implementations not illustrated or described herein fall within the scope of the present invention and the appended claims.

Conventionally, P-channel MOS (PMOS) transistor devices have not been used in electrostatic discharge (ESD) protection devices in snapback conduction mode. Voltages generally increase in PMOS devices, which result in high power dissipation and poor ESD protection. According to one or more aspects of the present invention, a PMOS device is utilized in creating an ESD protection device. In particular, the inventors of the present invention have observed that with device scaling and corresponding shrinking of device dimensions, the behavior of the PMOS device becomes suitable for use in ESD protection devices as snapback is occurring at reasonable levels. Additionally, a trigger voltage Vt1 wherein a PMOS ESD protection device turns on is also reduced in accordance with one or more aspects of the present invention. This voltage value is a function of, among other things, the breakdown and/or gain of a parasitic bipolar transistor (e.g., a lateral PNP, or LPNP) associated with the PMOS device. The higher the gain (beta) of the transistor, the lower Vt1 can be and the earlier the device can turn on to redirect potentially harmful ESD current(s). The gain of the transistor is a function of, among other things, the gate length or base width of the transistor. The shorter the base of the transistor, the higher the beta is, and the lower Vt1 can be. It will be appreciated that intrinsic advantages of PMOS devices (e.g., power dissipation) are maintained as technology nodes/gate lengths are decreased during scaling.

The PMOS device utilized in accordance with one or more aspects of the present invention is implemented in a local clamping scheme designed to protect inter alia metal-oxide semiconductor (MOS) integrated circuits (ICs), wherein a parasitic bipolar transistor (e.g., a lateral PNP, or LPNP) associated with the PMOS clamp device turns on to conduct ESD currents from a pad to ground. The bipolar transistor is formed from the PMOS device, wherein the N-type doped channel between a drain and source of the transistor acts as the PNP base, and the P-type drain and source act as a bipolar collector and emitter, respectively. Typically, the source, gate and well tie of the PMOS are connected to the pad or pin to be protected and the drain is tied to ground. Current flowing through the well to the drain creates a base to emitter voltage (Vbe) sufficient to turn on the bipolar device, whereby further ESD current flows from the source (emitter) at the pad to the grounded drain (collector).

The parasitic bipolar transistor (LPNP) operates in a snapback region when the ESD event brings the potential of the pad or pin positive with respect to ground. In order to provide effective ESD protection, it is desirable to provide an LPNP having a low trigger voltage to begin snapback operation, as well as a high ESD current capability within the snapback region. The LPNP enters the snapback region of operation upon reaching an initial trigger voltage Vt1 having a corresponding current It1. Thereafter, the LPNP conducts ESD current to ground to protect other circuitry in the IC. Should ESD current exceed a second breakdown current level It2 at a corresponding voltage Vt2, thermal runaway may be induced in the protective clamp device, wherein the reduction of the impact ionization current is offset by the thermal generation of one or more carriers. This breakdown is initiated in a device under stress as a result of self-heating, and may cause failure of the ESD clamping device, allowing ESD currents to damage other circuitry in the IC. To avoid such events, it is therefore desirable to provide LPNP clamping devices having high It2 breakdown current ratings.

Accordingly, the PMOS transistor and associated LPNP are designed for relatively large current conduction, and typically include multiple fingers for each of the drain, source, and gate to spread out the current. One problem with such multi-finger devices is found where Vt1 is greater than Vt2. In this situation, one finger of the device may turn on, causing operation of a portion of the device to operate in snapback mode. Thereafter, the remaining fingers may not reach Vt1 due to the snapback operation of the first finger. As a result, the full ESD current conduction capability for the LPNP is not utilized, and the current may exceed breakdown levels for the fingers operating in the snapback region, resulting in thermal device failure. Accordingly, it is desirable to provide multi-finger LPNPs having Vt2 greater than Vt1 to facilitate all the fingers transitioning into the snapback region in a predictable fashion and thereby avoiding such unintended ESD protection device failure.

Referring initially to FIG. 1, a portion of an integrated circuit 100 suitable for implementing one or more aspects of the present invention is illustrated schematically with an I/O pad 102 for connection of an I/O buffer circuit 104 with devices or circuitry (not shown). An ESD protection LPNP 106 is provided, acting as a local clamp device to conduct ESD currents from the pad 102 to ground. A diode 108 may optionally be included to provide ESD currents to a power supply rail Vdd in combination with the local clamp LPNP 106. During an ESD event, a well current Iwell 110 flows from the well contact of the LPNP 106 through a well resistance Rwell 112, thereby creating a base voltage Vbe at the base B and turning the LPNP 106 on. The LPNP 106 then conducts ESD current from the pad 102 at emitter E to the grounded collector C in snapback operation to protect the I/O buffer 104 and other circuitry in the IC 100 from ESD damage.

Figure 2:
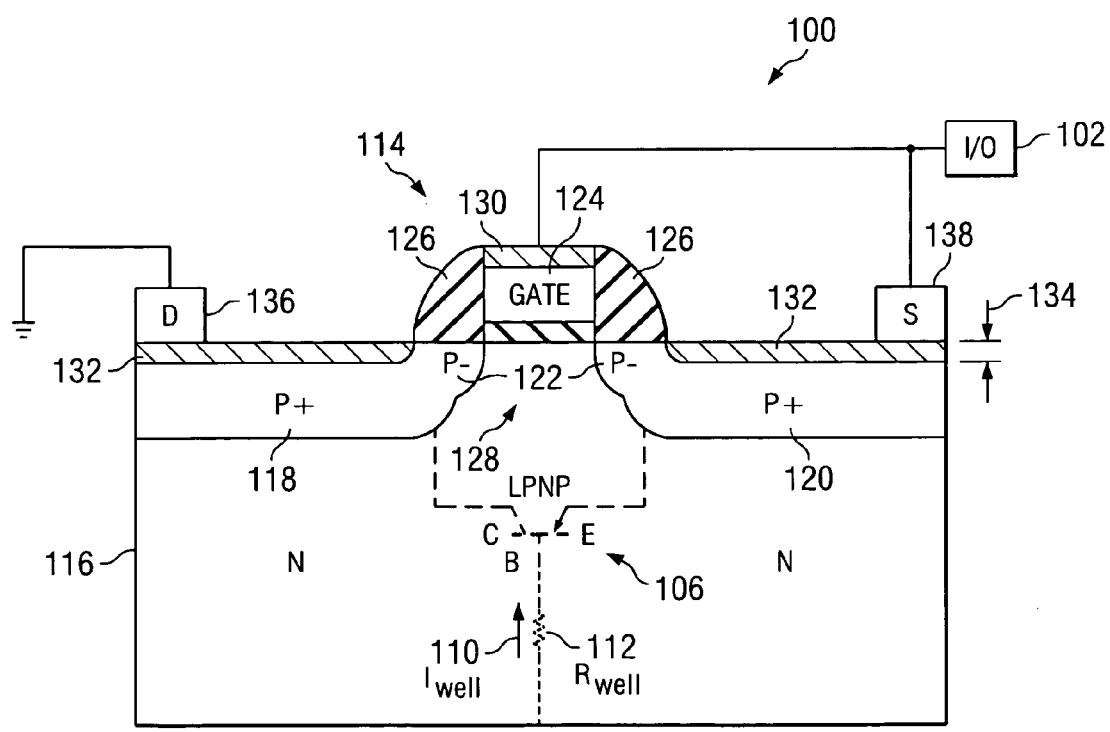
FIG. 2 is a cross-sectional side view schematically illustrating a PMOS transistor and associated lateral bipolar PNP (LPNP) transistor according to one or more aspects of the present invention.

As further illustrated in FIG. 2, the LPNP 106 (depicted in phantom) is formed from portions of a PMOS transistor 114. The PMOS 114 is formed from a substrate 116 doped with N-type dopants, in which P-type drain and source regions 118 and 120 are created, respectively. For example, the regions 118 and 120 are implanted in the substrate 116 with P+ dopants and may further comprise lightly doped (e.g., P−) areas 122 partially underlying a gate 124. The gate 124 comprises, for example, a polysilicon structure 126 overlying an N-type channel region 128 in the substrate between the drain and source regions 118 and 120. The gate 124 includes a silicide region 130 by which the gate 124 may be connected to the pad. The upper portions of the drain and source regions 118 and 120 also include silicide regions 132, wherein the silicide 130 and 132 have a thickness 134. In the example shown, the drain region 118 is grounded through the suicide 132 and a contact 136, and the source region 120 is connected to the pad 102 via a contact 138 as is the gate 124 and substrate or well region 116.

The lateral PNP bipolar transistor (LPNP) 106 of FIG. 1 is formed from the PMOS device 114, wherein the P-type source region 120 acts as the emitter E, the P-type drain region 118 functions as the collector C, and the N type channel region 128 therebetween functions as the base B of the LPNP 106. During an ESD event, ESD current travels from the well contact at the pad 102, through the well 116 toward the ground, creating the well current Iwell 110. This current Iwell 110, in turn, causes a voltage across the well resistance Rwell 112 that turns on the bipolar LPNP 106.

Figure 3:
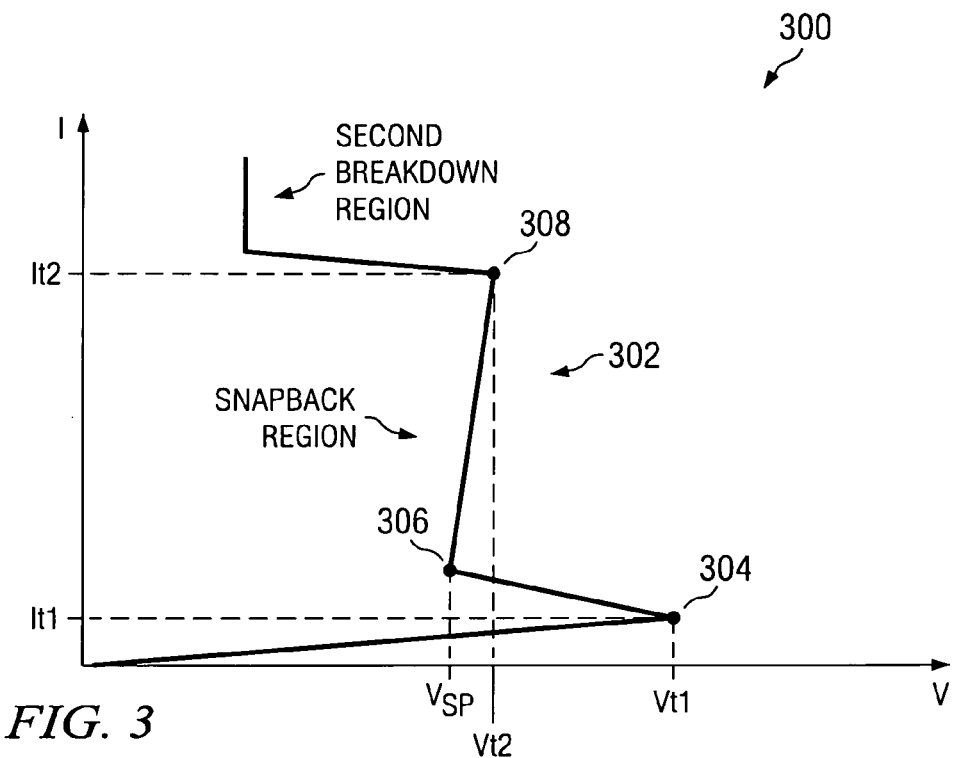
FIG. 3 is a graph illustrating a current versus voltage curve for a PMOS ESD having snapback and breakdown regions.
Figure 4:
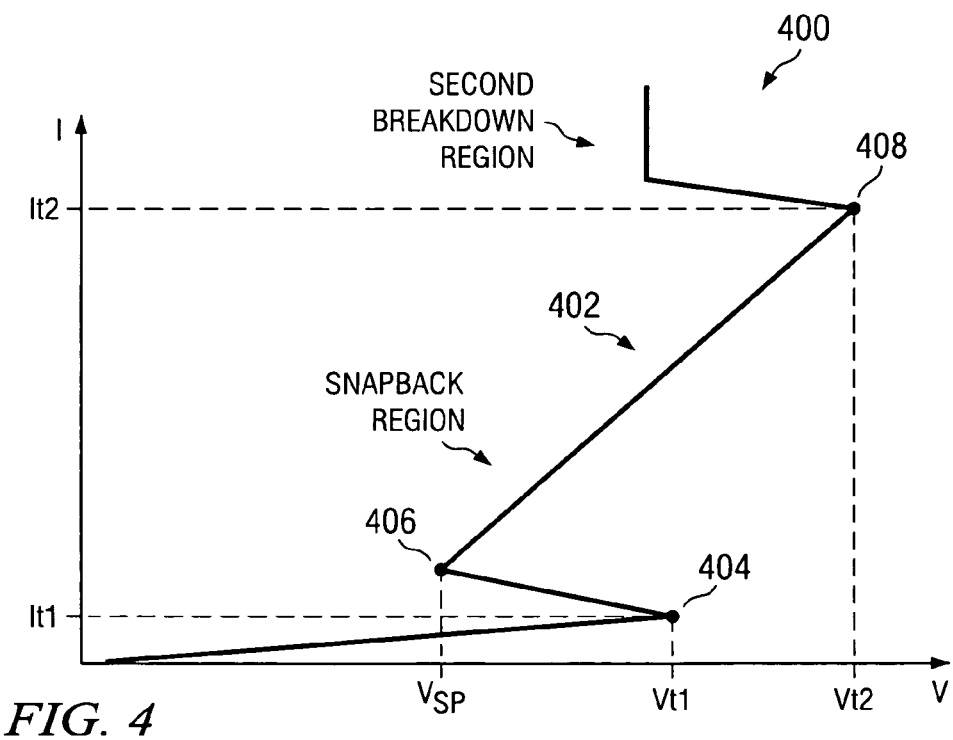
FIG. 4 is a graph illustrating another current versus voltage curve for a PMOS ESD clamp having snapback and breakdown regions, where a second breakdown voltage is greater than a first triggering voltage.

FIGS. 3 and 4 are graphical depictions 300, 400 that illustrate exemplary current (y axis) versus voltage (x axis) curves 302 and 402, respectively, for PMOS ESD devices where an associated LPNP operates to conduct ESD currents in a snapback region, and may undergo thermal failure if operated in a second breakdown region. In FIG. 3, the LPNP (e.g., LPNP 106 of FIGS. 1 and 2) conducts along the curve 302 until an initial trigger voltage Vt1 304 (e.g., the source-to-drain breakdown voltage of the ESD clamp 114) is reached at a current It1, after which the voltage drops to a snapback voltage Vsp 306. The device then conducts ESD currents up to a current level It2 at corresponding voltage Vt2 308, after which the device enters a second breakdown region where thermal breakdown occurs. The device therefore provides ESD protection for currents below It2. Accordingly, it is desirable to maximize It2 in such protection devices. In the curve 302 of FIG. 3, it is noted that the voltage level Vt1 304 is greater than Vt2 308. As discussed above, this situation can cause undesirable operation of ESD clamps having multi-finger architectures, wherein one or more fingers of the device fail to enter the snapback region by virtue of other fingers entering snapback. It is thus further desired to provide a device wherein Vt2 is greater than Vt1.

Referring now to FIG. 4, the exemplary current (y axis) versus voltage (x axis) curve 402 is illustrated for a situation wherein the LPNP conducts until an initial trigger voltage Vt1 404 is reached at a current It1, after which the voltage drops to a snapback voltage Vsp 406. The device then conducts ESD currents up to a current level It2 at corresponding voltage Vt2 408, after which the device enters a second breakdown region where thermal breakdown occurs. When the PMOS operates in the snapback mode or the bipolar breakdown region, the LPNP conducts most of the drain terminal current. It has been found that It2 depends on the Beta or gain of the LPNP, the PMOS channel region length, the silicide thickness, and the drain junction depth, among other things.

Figure 5:
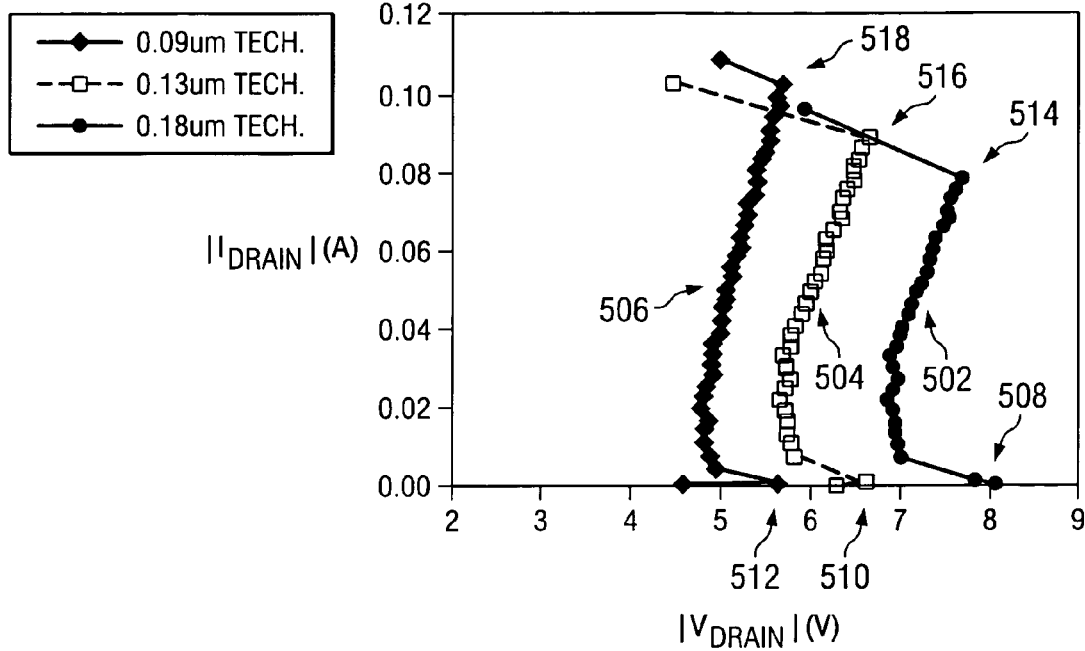
FIG. 5 is a graphical depiction illustrating three different current versus voltage curves for three different PMOS ESD protection devices utilizing three different technology dimensions.

FIG. 5 is a graphical depiction 500 illustrating three different current (y axis) versus voltage (x axis) curves 502, 504, 506 for three different PMOS ESD protection devices utilizing three different technology dimensions, namely 0.18, 0.13 and 0.09 micrometers, respectively. It can be seen that as technology is scaled down performance of lateral PNP bipolar transistor (LPNP) is significantly improved (e.g., reduced snapback or trigger voltage, and increased maximum failure current It2 which increases efficiencies as more current can be sustained within the same dimensioned device). Nevertheless, respective trigger voltages Vt1 508, 510, 512 of the curves 502, 504, 506 are generally greater than breakdown levels occurring at respective second voltages Vt2 514, 516, 518.

Figure 6:
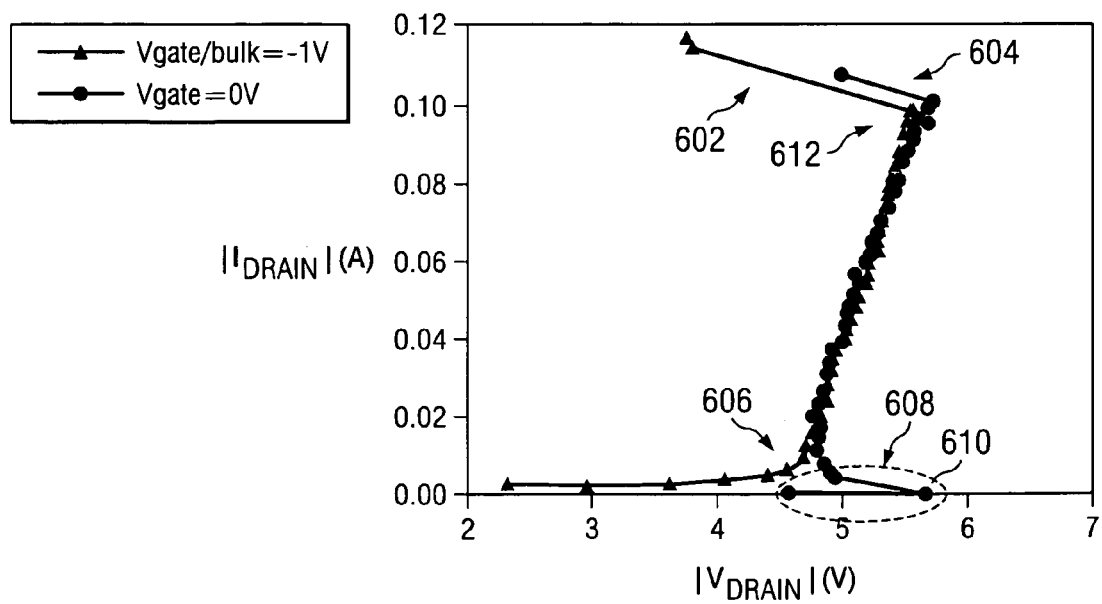
FIG. 6 a graphical depiction illustrating additional current versus voltage curves for PMOS ESD protection devices, wherein a snapback leg has been removed from at least one of the curves.

FIG. 6 is a graphical depiction 600 of additional current (y axis) versus voltage (x axis) curves 602, 604 for PMOS ESD protection devices. Curve 602 (defined by the triangular shaped points) actually represents two curves corresponding to situations where 1) a gate of a PMOS device utilized in an ESD protection device is negatively coupled up to negative one volt (e.g., Vgate=−1, gate coupling), or 2) a substrate or bulk of a PMOS device utilized in an ESD protection device is negatively coupled up to negative one volt (e.g., Vbulk=−1, substrate coupling). Curve 604 (defined by the round points) corresponds to a situation where a gate of a PMOS device utilized in an ESD protection device is grounded (e.g., Vgate=0). Such configurations are discussed in further detail below with regard to protection during positive ESD events.

Curve 602 is capable of being produced in accordance with one or more aspects of the present invention and depicts a more desirable circuit operation. In particular, a trigger voltage Vt1 606 is reduced in this curve 602 via removal of a snapback leg, such as a leg 608 (encircled in phantom) in curve 604 established by point 610 (as well as similar snapback legs in curves 302, 402, 502, 504 and 506 depicted in FIGS. 3, 4 and 5 established by points 304, 404, 508, 510, 512, respectively). In this manner, an ESD protection device capable of yielding this curve would turn on sooner (e.g., at a lower voltage) to afford additional ESD protection. Additionally, unlike curve 604 (and curve 302 depicted in FIG. 3 and curves 502, 504 and 506 depicted in FIG. 5), curve 602 does not enter a second breakdown region at a corresponding voltage Vt2 612 that is less than Vt1 606. This mitigates the occurrence of the undesirable situation discussed above wherein less than all of the fingers of a multi-finger architecture would turn on during a positive ESD event.

FIG. 7 illustrates a cross sectional schematic view of at least a portion of a wafer whereon a gate coupling arrangement 700 is disposed in accordance with one or more aspects of the present invention. A lateral PNP parasitic bipolar transistor (LPNP) 702 is formed within a PMOS transistor 704. The PMOS transistor 704 is formed upon a substrate or bulk material 706 doped with N-type dopants, and includes a gate 708 and P-type drain 710 and source 712 regions. The P-type drain 710 and source 712 regions are formed within the substrate 706 and may be established, for example, by doping respective areas of the substrate with P+ dopants. The substrate 706 serves as an N-well (e.g., an N-well formed within a lightly doped p-type substrate) and has a resistance $R_{NWELL}$ 714 associated therewith. The N-type doped substrate 706 also establishes an N-type channel 716 under the gate 708.

The LPNP 702 includes a base "B", collector "C" and emitter "E", and is formed from the PMOS device 704. In particular, the P-type source region 712 acts as the emitter E, the P-type drain region 710 functions as the collector C, and the N type channel region 714 functions as the base B of the LPNP 702. In the exemplary gate coupling arrangement illustrated, an I/O pad or power supply pad 718 is operatively coupled to the gate 708 through a gate resistance Rhd GATE 1 720. The pad 718 is also coupled to the source 712 and bulk 706 of the PMOS transistor 704, and the drain 710 is connected to ground. The voltage at the pad 718 is illustrated as greater than zero (e.g., $V_{PAD}$>0). This is indicative of a positive ESD event. Negative gate-to-source voltages are needed to activate the device and thus protect against positive ESD events. Accordingly, the voltage at the gate 708 is illustrated as being less than zero (e.g., $V_{GS}$<0). When a positive ESD event occurs, current flows from the I/O pad 718 through $R_{GATE}$ 720 causing a voltage drop between the gate 708 and the source 712, (which is connected to the I/O pad 718). The gate voltage is thus less than the source voltage, and the gate to source voltage of the PMOS device can be said to be negative (e.g., Vg−Vs equals some negative value), and the ESD device is then activated to protect against the ESD event.

It will be appreciated that this gate coupling arrangement is operable to facilitate removal of a snapback branch in a curve produced by a PMOS device utilized in an ESD protection device. For example, this technique can be implemented to produce a curve similar to curve 602 depicted in FIG. 6, which lacks a snapback leg and which has a correspondingly reduced trigger voltage Vt1 that is les than a second voltage Vt2 which corresponds to a second breakdown region.

FIG. 8 is a schematic illustration of a circuit arrangement 800 suitable to effect gate coupling (e.g., as described with respect to FIG. 7) in implementing a PMOS ESD protection device in accordance with one or more aspects of the present invention. An I/O pad (or a power supply pad) 802 is operatively coupled to a PMOS device 804 that includes a source 806, drain 808, bulk portion 810 and gate 812. In the illustrated example an overlap capacitance between the gate 812 and the drain 808 is depicted as $C_{BOOT}$ 814. It will be appreciated, however, that $C_{BOOT}$ can be externally placed according to the need of the circuits. A gate resistance (e.g., on the order of about 10–15 kilo-ohms) is similarly illustrated as $R_{GATE}$ 816 between the gate 812 and the pad 802, and may comprise, for example, an N-well resistor.

The drain 808 is coupled to ground, and the source 806 and bulk 810 are operatively coupled to the pad 802. The gate 812 is also operatively coupled to the pad 802 through the gate resistance $R_{GATE}$ 816. The gate 812 is similarly coupled to the drain 808 and ground through the overlap or externally placed capacitance $C_{BOOT}$ 814. The PMOS transistor 804 is activated during a positive ESD event to protect circuitry coupled to the pad 802. When a positive ESD event occurs, current flows from the I/O pad 802 through the gate resistance $R_{GATE}$816. Current flowing across this resistance 816 causes a voltage drop at the gate node 812 of the transistor 804. The gate voltage is thus less than the source voltage, and the gate to source voltage of the PMOS device can be said to be negative (e.g., Vg−Vs equals some negative value). In this manner, a gate coupling condition occurs and the transistor 804 turns on to discharge the ESD.

It will be appreciated that the frame of reference is flipped such that the drain 808 is more negative than the source 806, gate 812 and bulk 810. This is done because for a PMOS to go into snapback a negative voltage has to appear at the drain 808. To generate such a voltage, a positive voltage is applied to the source 806, gate 812 and bulk 810, while the drain 808 is tied to ground. In this manner, the drain 808 is at a lower potential than the source 806, gate 812 and bulk 810. An effective gate coupling is thereby achieved because the gate 812 is negative relative to the source 806. This configuration 800 is thus capable of producing a curve similar to curve 602 depicted in FIG. 6 corresponding to a situation where Vgate is coupled up to minus one volt (e.g., Vgate=−1V) whereby a triggering voltage Vt1 is reduced via removal of a snapback leg in the curve.

FIG. 9 is a schematic illustration of yet another circuit arrangement 900 suitable to effect gate coupling in implementing a PMOS ESD protection device in accordance with one or more aspects of the present invention. A PMOS transistor 904 is included and comprises a source 906, drain 908, bulk portion 910 and gate 912. The drain 908 of the transistor 904 is connected to ground, while the source 906 and bulk portion 910 are coupled to an I/O pad (or power supply pad) 914. The gate 912 of the PMOS transistor 904 is operatively coupled to the pad 914 through a negative voltage charge pump 916. The negative voltage charge pump 916 is utilized to pull hole current out of the gate 912 of the PMOS during an ESD pulse. In this manner, during a positive ESD event, a negative voltage can be established at the gate 912 relative to the source 906 to activate the PMOS ESD protection device. It will be appreciated that such a charge pump 916 can be implemented in any number of suitable ways, such as, for example, via an oscillator operatively coupled to a diode capacitor that is negatively biased during an ESD event which drives a node negative, such as gate node 912, for example.

Figure 10:
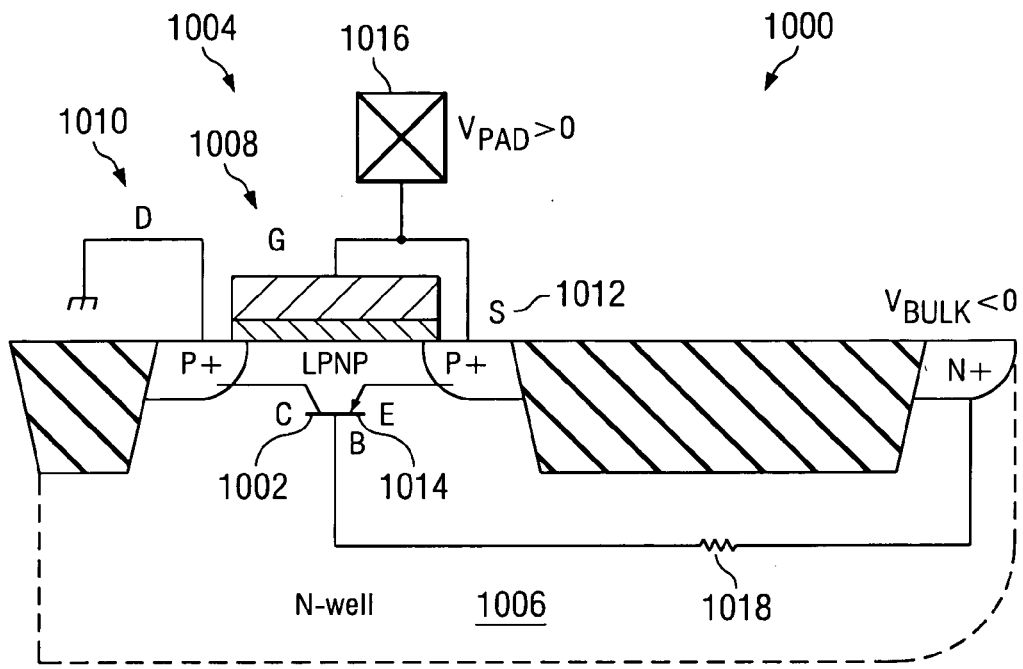
FIG. 10 illustrates a cross sectional schematic view of at least a portion of a wafer whereon a substrate coupling arrangement is disposed in accordance with one or more aspects of the present invention.

FIG. 10 illustrates a cross sectional schematic view of at least a portion of a wafer whereon a substrate coupling arrangement 1000 is disposed in accordance with one or more aspects of the present invention. FIG. 10 is similar to FIG. 7, but depicts a substrate coupling arrangement 1000 rather than a gate coupling arrangement. A lateral PNP parasitic bipolar transistor (LPNP) 1002 is formed within a PMOS transistor 1004. The PMOS transistor 1004 is formed upon a substrate or bulk material 1006 doped with N-type dopants, and includes a gate 1008 and P-type drain 1010 and source 1012 regions. The P-type drain 1010 and source 1012 regions are formed within the substrate 1006 and may be established, for example, by doping respective areas of the substrate with P+ dopants. The substrate 1006 serves as an N-well and establishes an N-type channel 1014 under the gate 1008.

The LPNP 1002 includes a base "B", collector "C"0 and emitter "E", and is formed from the PMOS device 1004. In particular, the P-type source region 1012 acts as the emitter E, the P-type drain region 1010 functions as the collector C, and the N type channel region 1014 functions as the base B of the LPNP 1002. In the exemplary gate coupling arrangement illustrated, an I/O pad or power supply pad 1016 is operatively coupled to the gate 1008 and source 1012 of the PMOS transistor 1004, and the drain 1010 is connected to ground. The well 1006 has a resistance represented by a resistor 1018. The voltage at the pad 1016 is illustrated as being greater than zero (e.g., $V_{PAD}$>0) to indicate a positive ESD event. Negative voltages are needed at the well to protect against positive ESD events. Accordingly, the voltage at the well (bulk of the PMOS) 1006 is illustrated as being less than zero (e.g., $V_{BULK}$<0). Such a biased situation may, for example, be accomplished via use of a charge pump.

Figure 11:
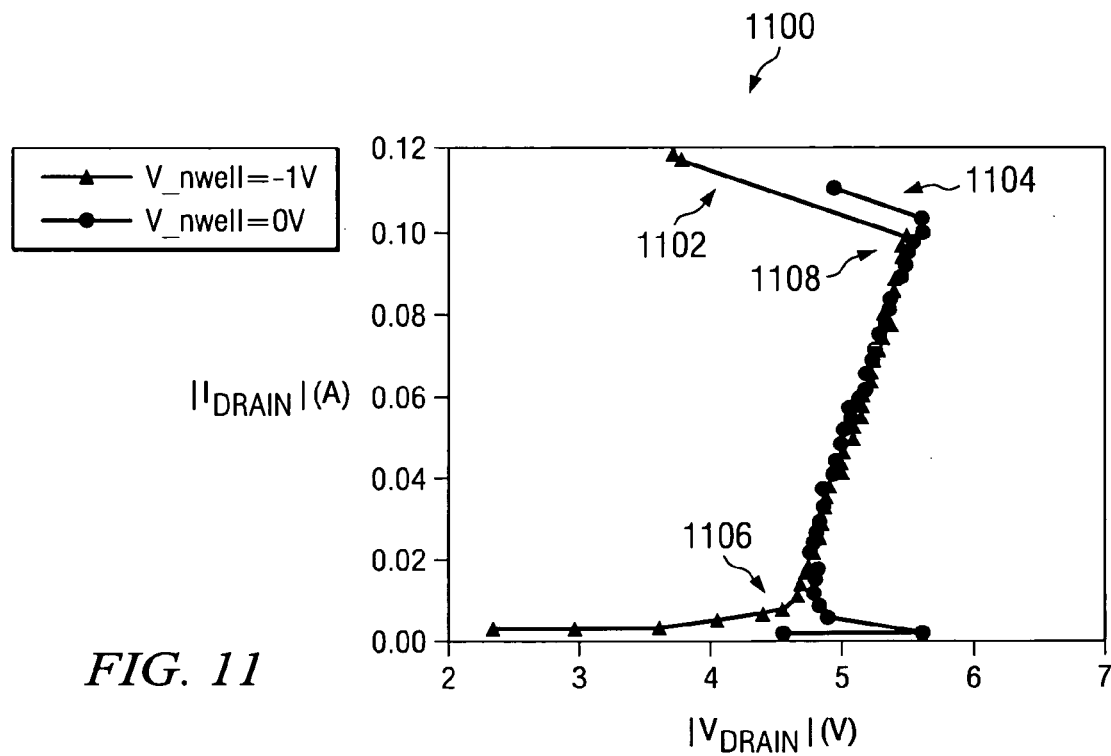
FIG. 11 is a graphical depiction illustrating current versus voltage curves for PMOS ESD protection devices, wherein a snapback leg has been removed from at least one of the curves.

FIG. 11 is a graphical depiction 1100 of current (y axis) versus voltage (x axis) curves similar to that depicted in FIG. 6. However, the curves 1102, 1104 relate solely to substrate coupling in PMOS ESD protection devices. In particular, curve 1102 (defined by the triangular shaped points) corresponds to a situation where an N-type doped bulk or well of a PMOS transistor utilized in an ESD protection device is negatively coupled up to negative one volt (e.g., Vnwell=−1V). Curve 1104 (defined by the round points) corresponds to a situation where a substrate of a PMOS device utilized in an ESD protection device is grounded (e.g., Vnwell=0). Curve 1102 illustrates removal of a snapback leg and reduction of a trigger voltage Vt1 1106 such that Vt1 1106 is less than a second voltage Vt2 1108 corresponding to a second breakdown region, where Vt2 1108 is greater than Vt1 1106.

FIG. 12 is a schematic illustration of a circuit arrangement 1200 suitable to effect substrate coupling in implementing a PMOS ESD protection device in accordance with one or more aspects of the present invention. The arrangement may, for example, be able to produce a curve similar to curve 1102 illustrated in FIG. 11. A PMOS transistor 1204 is included in the arrangement and comprises a source 1206, drain 1208, bulk portion 1210 and gate 1212. The bulk portion or substrate 1210 of the PMOS transistor 1204 may be doped with one or more N-type dopants and may serve as an N-well. The drain 1208 of the trans is connected to ground, while the source 1206 and gate 1212 are coupled to an I/O pad (or power supply) 1214. The bulk portion 1210 is operatively coupled to the pad 1214 through a negative voltage charge pump 1216. The negative voltage charge pump 1216 is utilized to pull hole current out of the substrate 1210 of the PMOS device during a positive ESD event. In this manner, a negative voltage is established at the bulk 1210 during a positive ESD event to activate the PMOS ESD protection device. It will be appreciated that such a charge pump 1216 can be implemented in any number of suitable ways, such as, for example, via an oscillator operatively coupled to a diode capacitor that is negatively biased during an ESD event to drive a node, such as bulk node 1210, negative.

Accordingly, one may now appreciate that one or more aspects of the present invention provide a PMOS ESD protection device. Such a device enjoys advantages of PMOS technologies (e.g., efficiencies with regard to power dissipation) and become even more efficient when gate coupling and/or substrate coupling are implemented. In particular, reduced voltage in snapback yields a corresponding reduction in power dissipation. Although the invention has been shown and described with respect to one or more implementations, equivalent alterations and modifications will occur to others skilled in the art based upon a reading and understanding of this specification and the annexed drawings.

The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An ESD protection circuit, for providing ESD protection to a pad, comprising:
   a PMOS transistor having a source region, a drain region, a gate, and a bulk region, wherein the source region is coupled to the pad, the drain region is coupled to ground, the gate is coupled to the pad, and the bulk region is coupled to a charge pump; and
   a coupling circuit coupled to the PMOS transistor, and operable to generate either a negative gate to source voltage or a negative bulk to source voltage for the PMOS transistor during a positive electrostatic discharge event, thereby achieving a negative gate coupling or a negative bulk coupling for the PMOS transistor during the positive electrostatic discharge event.

2. The circuit of claim 1, wherein the bulk region is coupled to the pad and the gate is coupled to the pad through a gate resistance.

3. The circuit of claim 2, wherein the gate resistance is on the order of about 10–15 kilo-ohms.

4. The circuit of claim 1, wherein the bulk region is doped with an N-type dopant and an N-type channel region exists between the source region and drain region and below the gate,
   wherein the source region and drain region are formed within the bulk region by doping respective portions of the bulk region with P-type dopants,
   wherein the N-type channel region functions as a base of an associated lateral PNP parasitic bipolar transistor, the P-type source region functions as an emitter E of the associated lateral PNP parasitic bipolar transistor and the P-type drain region functions as a collector C of the associated lateral PNP parasitic bipolar transistor, and
   wherein the bulk region serves as an N-well and has a resistance $R_{NWELL}$ associated therewith.

5. The circuit of claim 1, wherein the circuit turns on at a trigger voltage corresponding to a first breakdown region, where the trigger voltage is less than a second voltage corresponding to a second breakdown region.

6. An ESD protection circuit, for providing ESD protection to a pad, comprising:
   a PMOS transistor having a source region, a drain region, a gate, and a bulk region, wherein the source region is coupled to the pad, the drain region is coupled to ground, the bulk is coupled to the pad, the gate is coupled to the pad through a gate resistance and the gate is further coupled to the drain region and ground through an overlap capacitance between the gate and the drain region; and
   a coupling circuit coupled to the PMOS transistor, and operable to generate either a negative gate to source voltage for the PMOS transistor during a positive electrostatic discharge event, thereby achieving a negative gate coupling for the PMOS transistor during the positive electrostatic discharge event.

7. The circuit of claim 6, wherein the gate resistance is on the order of about 10–15 kilo-ohms.

8. An ESD protection circuit, for providing ESD protection to a pad, comprising:
a PMOS transistor having a source region, a drain region, a gate, and a bulk region, wherein the source region is coupled to the pad, the drain region is coupled to ground, the bulk region is coupled to the pad and the gate is coupled to the pad through a negative voltage charge pump; and
a coupling circuit coupled to the PMOS transistor, and operable to generate either a negative gate to source voltage or a negative bulk to source voltage for the PMOS transistor during a positive electrostatic discharge event, thereby achieving a negative gate coupling or a negative bulk coupling for the PMOS transistor during the positive electrostatic discharge event.

9. The circuit of claim 8, wherein the negative voltage charge pump comprises an oscillator operatively coupled to a diode capacitor that is negatively biased during a positive ESD event to drive the gate negative.

10. An ESD protection circuit, for providing ESD protection to a pad, comprising:
a PMOS transistor having a source region, a drain region, a gate, and a bulk region, wherein the source region is coupled to the pad, the drain region is coupled to ground the gate is coupled to the pad and the bulk region is coupled to the pad through a negative voltage charge pump; and
a coupling circuit coupled to the PMOS transistor, and operable to generate either a negative gate to source voltage or a negative bulk to source voltage for the PMOS transistor during a positive electrostatic discharge event, thereby achieving a negative gate coupling or a negative bulk coupling for the PMOS transistor during the positive electrostatic discharge event.

11. The circuit of claim 10, wherein the negative voltage charge pump comprises an oscillator operatively coupled to a diode capacitor that is negatively biased during a positive ESD event to drive the bulk negative.

* * * * *